United States Patent [19]
Fallica

[11] Patent Number: 5,530,271
[45] Date of Patent: Jun. 25, 1996

[54] INTEGRATED STRUCTURE ACTIVE CLAMP FOR THE PROTECTION OF POWER SEMICONDUCTOR DEVICES AGAINST OVERVOLTAGES

[75] Inventor: Piero G. Fallica, Catania, Italy

[73] Assignee: Consorzio Per La Ricerca Sulla Microelettronica Nel Mezzogiorno, Catania, Italy

[21] Appl. No.: 354,481

[22] Filed: Dec. 12, 1994

[30] Foreign Application Priority Data

Dec. 13, 1993 [EP] European Pat. Off. .............. 93830497

[51] Int. Cl.⁶ .................................................. H01L 29/74
[52] U.S. Cl. ......................... 257/173; 257/341; 257/355; 257/360; 257/546
[58] Field of Search ................................ 257/173, 355, 257/546, 341, 360

[56] References Cited

U.S. PATENT DOCUMENTS

| 3,806,773 | 4/1974 | Watanabe | 257/546 |
| 5,162,966 | 11/1992 | Fujihira | 257/140 |
| 5,221,850 | 6/1993 | Sakurai | 257/173 |

FOREIGN PATENT DOCUMENTS

| 0102696 | 3/1984 | European Pat. Off. . |
| 0296675 | 12/1988 | European Pat. Off. . |
| 0437939 | 7/1991 | European Pat. Off. . |
| 2146323 | 7/1972 | France . |
| 90178908 | 7/1990 | Japan . |

OTHER PUBLICATIONS

Patent Abstracts of Japan, vol. 14, No. 541 (E–1007) Nov. 29, 1990 & JP–A–02 230 774 (Fujitsu).
Patent Abstracts of Japan, vol. 13, No. 421 (E–822) Sep. 19, 1989 & JP–A–01 157 575 (NEC).
Patent Abstracts of Japan, vol. 17, No. 104 (E–1328) Mar. 3, 1993 & JP–A–04 291 767 (Fuji).

*Primary Examiner*—Edward Wojciechowicz
*Attorney, Agent, or Firm*—David M. Driscoll; James H. Morris; John N. Anastasi

[57] ABSTRACT

An integrated structure active clamp for the protection of a semiconductor power device against overvoltages includes at least one first diode and at least one second diode defined in a lightly doped layer of a first conductivity type in which the power device is also disposed. The first diode has a first electrode connected to a control electrode of the power device and a second electrode connected to a second electrode of the second diode. The second diode has a first electrode connected to a load driving electrode of the power device. The second electrode of the second diode is represented by a first buried region of a second conductivity type, which is buried in the lightly doped layer, and the first electrode of the second diode is represented by a first doped region of the first conductivity type which extends from a semiconductor top surface into the lightly doped layer to partially overlap the first buried region.

14 Claims, 1 Drawing Sheet

INTEGRATED STRUCTURE ACTIVE CLAMP FOR THE PROTECTION OF POWER SEMICONDUCTOR DEVICES AGAINST OVERVOLTAGES

BACKGROUND OF THE INVENTION

1. Field of the Invention

The present invention relates to an integrated structure active clamp for the protection of power semiconductor devices, such as power MOSFETs, IGBTs or power BJTs, against overvoltages.

2. Discussion of the Related Art

Dynamic clamp circuits are generally used in conjunction with power semiconductor devices, which drive inductive loads, to protect the power devices against overvoltages which are generated when the load current is switched off.

Dynamic clamp circuits are divided into two broad categories: active and passive clamp circuits.

A typical active clamp circuit comprises two zener diodes connected by their anodes, and a resistor. A first or reverse zener diode has its cathode connected to a terminal of the power device to which the inductive load is also connected, for example a drain terminal of a power MOSFET, a collector terminal of an Insulated Gate Bipolar Transistor (IGBT) or a collector terminal of a power Bipolar Junction Transistor (power BJT). A second or forward zener diode has its cathode connected to a driving electrode of the power device, i.e. the gate electrode of a power MOSFET, the gate electrode of an IGBT or the base electrode of a power BJT. The resistor is connected between the driving electrode of the power device and a driving terminal to which a driving signal is applied.

The operation of the circuit will now be explained referring for example to a power MOSFET. When the driving terminal is driven low, the power MOSFET is turned off. Due to the inductive nature of the load, an overvoltage appears on the drain terminal. If the zener voltage Vz of the first zener diode is lower than the breakdown voltage of the power MOSFET, when the voltage on the drain terminal exceeds Vz (more precisely, when the drain voltage exceeds Vz plus the forward voltage necessary to turn the second zener diode on), the first zener diode breaks down, and an electrical current flows through the two zener diodes and the resistor to the driving terminal. This current gives rise to a voltage drop across the resistor, thus raising the voltage on the gate terminal of the power MOSFET, which causes the power MOSFET to turn on again, so that the overvoltage is limited. The second zener diode is used to prevent current from flowing from the driving terminal to the drain terminal when the driving terminal is driven high (i.e. when the power device is switched on), so that a full 5 V signal can be applied to the gate electrode of the power MOSFET.

A clamp circuit such that described works better if it is integrated in the same chip of the power semiconductor device; in this case parasitic inductances are greatly reduced, as well as the operating times of the clamp circuit.

JP-A-4065878 (corresponding to U.S. Pat. No. 5,162,966) describes an active clamp circuit, which is suitable for being integrated in power MOSFET chips and is conceptually identical to the circuit described above, the only difference being a chain of serially connected first zener diodes instead of the single first zener diode. Each first zener diode has an anode region constituted by a P+ semiconductor region, obtained simultaneously with the deep body regions of the various elementary cells of the power MOSFET, and a cathode region constituted by an N+ semiconductor region also obtained within the anode region simultaneously with the source regions of the power MOSFET. The second zener diode has the cathode region connected to the gate electrode of the power device by means of a metal layer and the anode region connected to the anode region of an adjacent one of the first diodes. A cathode region of the last one of the series of first zener diodes is connected to the drain of the power MOSFET by means of an N+ contact region disposed on an Nepitaxial layer (also called "drift layer") which is grown over an N+ substrate and in which the elementary cells of the power device are also obtained.

When however such a structure is integrated in a power device, the breakdown voltage of the overall device is lower than the breakdown voltage of the power device alone, due to the presence of parasitic bipolar transistors, associated with each of the zener diodes, having emitter and base represented by the N+ cathode regions and by the P+ anode regions of the zener diodes, and collector represented by the Ndrift layer. When the power device is switched off, its gate and source are at the same potential, while the cathode region of the last zener diode of the chain of first zener diodes is at the same potential as the drain electrode of the power MOSFET; in such conditions, the breakdown voltage of the overall device is equal to the collector to emitter breakdown voltage (BVCEO) of the parasitic transistor. The breakdown voltage of the power MOSFET alone is given by the breakdown voltage of the junction between the deep body regions and the drift layer (BV CBO), since in each elementary cell of the power MOSFET the source and the deep body regions are short-circuited. Since the emitter to collector breakdown voltage is:

$$BV_{CEO} = BV_{CBO}/\sqrt{h_{FE}}$$

it appears that the breakdown voltage of the chip is greatly reduced with respect to the breakdown voltage of the power MOSFET taken alone.

Another disadvantage of this structure is that, since both the anode and cathode regions of the zener diodes are heavily doped semiconductor regions, the breakdown voltage of each diode is low. On the one hand, the low breakdown voltage makes it necessary to connect in series a certain number of diodes if a relatively high clamping voltage is to be attained. On the other hand, the low breakdown voltage limits the maximum voltage value of the driving signal which can be applied to the driving terminal of the power device without causing the zener diode which has the cathode connected to the gate electrode of the power device to break down when the power device is switched on.

In Japanese Application JP-A-055202 (corresponding to U.S. Pat. No. 5,221,850), an active clamp structure is disclosed comprising a silicon junction diode and a polysilicon junction diode, connected in series. The polysilicon diode has the cathode connected to the gate of the power MOSFET; the silicon diode has an anode comprising a deep P+ region which is deeper than the P+ deep body regions of the elementary cells, and the cathode is connected to the drain of the power MOSFET through the Ndrift layer. Since the junction of the silicon diode is deeper than the junction between the deep body regions of the cells and the drift layer, the breakdown voltage of the silicon diode is lower than that of the power MOSFET as is desired, and a clamping action is therefore achieved.

This structure has two advantages with respect to the previous one. First, it is more compact, since it is not necessary to have a chain of series diodes. Second, since the polysilicon diode is fabricated in a polysilicon layer deposited over an insulating oxide layer, it is electrically isolated from the Ndrift layer and thus from the drain of the power MOSFET, and no parasitic transistors are therefore formed. The overall breakdown voltage is therefore not reduced as was the case with the previous described structure.

The main disadvantage of this structure resides in that the breakdown voltage of the silicon diode (i.e. the clamping voltage of the active clamp) depends on the thickness of the drift layer under the anode region of the diode. Since the drift layer is normally an epitaxial layer, its resistivity and thickness vary from wafer to wafer and from lot to lot, and the value of the clamping voltage is therefore variable. Another disadvantage is given by the long diffusion time required to obtain the deep anode region of the silicon diode; this causes the doping concentration profile of the drain of the MOSFET to vary.

SUMMARY OF THE INVENTION

In view of the state of art described above, an object of the present invention is to realize an integrated structure active clamp which is not affected by the above mentioned drawbacks.

According to the present invention, such object is attained by means of an integrated structure active clamp for the protection of a power semiconductor device against overvoltages, having at least one first diode and at least one second diode defined in a lightly doped layer of a first conductivity type in which a power device is also obtained. The first diode has a first electrode connected to a control electrode of the power device and a second electrode connected to a second electrode of the second diode. A first electrode of said second diode is connected to a load driving electrode of the power device. The second electrode of the second diode is represented by a first buried region of a second conductivity type which is buried in the lightly doped layer and the first electrode of the second diode is represented by a first doped region of the first conductivity type which extends from a semiconductor top surface into the lightly doped layer to partially overlap the first buried region.

With the present invention, the second diode has a breakdown voltage which does not depend on the resistivity or on the thickness of the lightly doped layer, and is therefore independent from statistical process variations. The breakdown voltage of the second diode depends on the dopant concentration in the first buried region and in the first doped region, and on their geometrical dimensions, both of which can be finely controlled. Since the breakdown voltage of the second diode determines the clamping voltage value of the active clamp structure, it follows that the clamping voltage value shows little statistical variations, and is well reproducible.

According to a preferred embodiment of the invention, the first diode has the second electrode represented by a second buried region of the second conductivity type which is buried in the lightly doped layer and the first electrode represented by a second doped region of the first conductivity type which extends from the semiconductor top surface to the second buried region, said second doped region having a dopant concentration intermediate between the dopant concentration in the lightly doped layer and the dopant concentration in the second buried region so as to reduce the gain of a parasitic bipolar transistor having an emitter, a base and a collector corresponding, respectively, to the second doped region, to the second buried region and the lightly doped layer.

An active clamp structure according to this preferred embodiment of the invention is very compact, and its working characteristics are not degraded by the existence of parasitic components.

The features of the present invention will be made more evident by the following detailed description of a preferred embodiment, illustrated as a non-limiting example in the annexed drawings, wherein:

DETAILED DESCRIPTION

Figure 1:
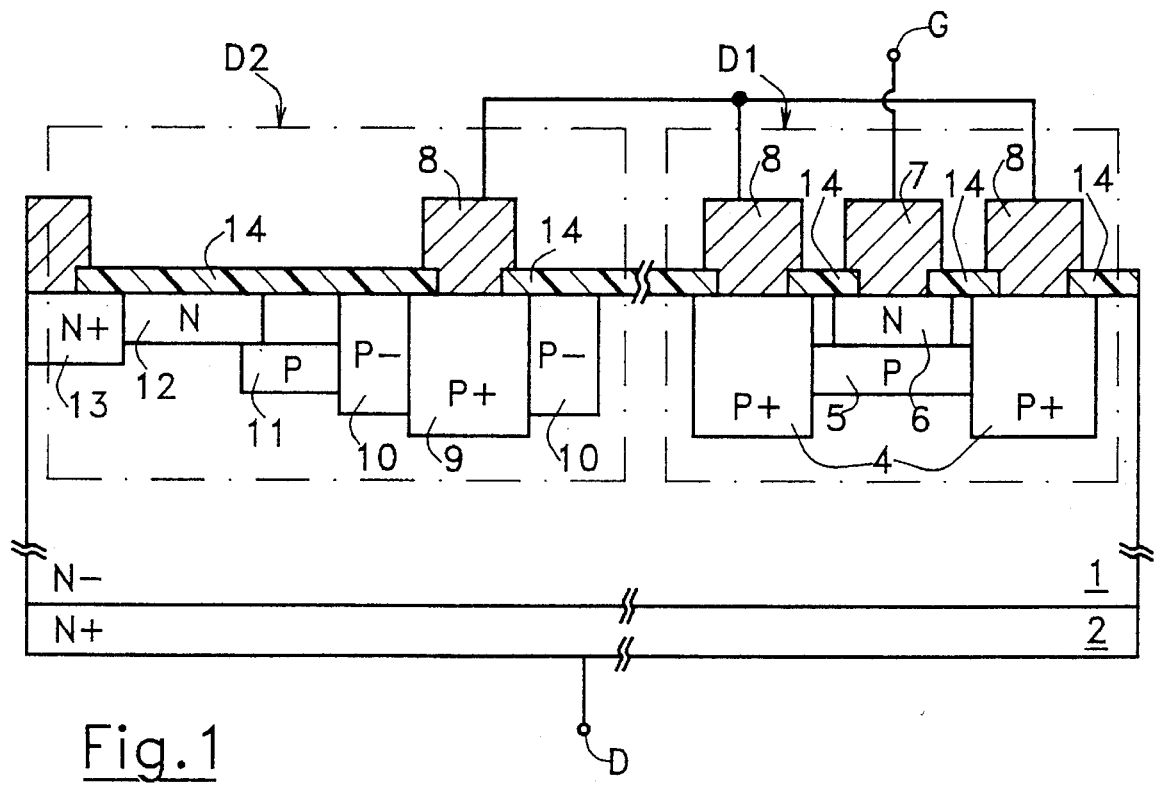
FIG. 1 is a cross-sectional view of an integrated structure active clamp according to the present invention.

With reference to FIG. 1, an integrated structure active clamp according to the invention is shown, which in the following description is supposed keep to be integrated in a power MOSFET chip; nothing changes in the case the active clamp structure is integrated in an IGBT or in a power BJT.

The active clamp structure comprises two silicon junction diodes, obtained in a lightly doped N-epitaxial layer 1 also called a "drift layer". The epitaxial layer 1 is grown over a heavily doped N+ layer 2 which represents a drain contact region for the power MOSFET.

A first diode D1 of the active clamp structure is surrounded by a heavily doped P+ deep annular region 4 which is fabricated simultaneously with deep body regions for elementary cells of the power device (not shown). Inside said annular region 4 a buried P type region 5 is obtained, constituting an anode region of the first diode D1, whose edges are merged with the annular region 4. Superimposed over said buried region 5 is an N type region 6 which extends from a semiconductor top surface and constitutes a cathode region of the diode D1.

The buried P type region 5 is obtained by implanting high-energy acceptor ions, for example boron ions, so that the resulting dopant concentration profile after diffusion has its maximum located under the semiconductor top surface, while at the semiconductor surface the acceptor ion concentration is of the same order of magnitude as the donor ion concentration in the lightly doped Nepitaxial layer 1. In practice, with an implantation energy of about 150 KeV the dopant concentration peak is located at about 0.4 um under the semiconductor surface. The cathode region 6, obtained by subsequent implantation and diffusion, can thus have a dopant concentration equal or even lower than that of the anode region 5.

Figure 2:
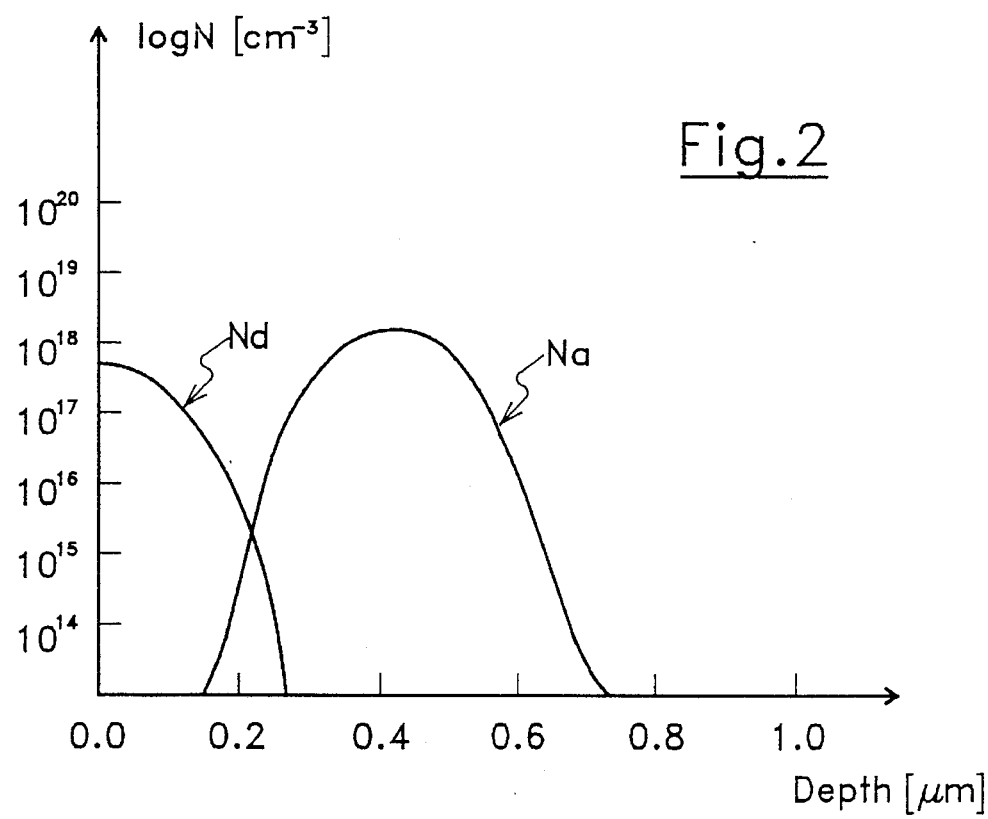
FIG. 2 shows a dopant concentration profile suitable to obtain such a structure.

With this configuration, it is possible to reduce the gain of a parasitic bipolar transistor having an emitter corresponding to the cathode region 6 of D1, a base corresponding to the anode region 5 of D1, and a collector corresponding to the epitaxial layer 1. The gain reduction of the parasitic bipolar transistor prevents the power MOSFET breakdown voltage from being reduced by the triggering of an emitter-collector breakdown of the parasitic bipolar transistor. In FIG. 2, Nd is the donor concentration profile in the cathode region 6 of D1, and Na is the acceptor concentration profile as a function of depth into the lightly doped layer in the anode region 5 of D1.

A second diode D2 of the active clamp structure comprises a deep P+ region 9 obtained simultaneously to the annular region 4 and to the deep body regions of the elementary cells of the power MOSFET. The deep P+ region 9 is surrounded by a lightly doped P annular region 10 suitable to prevent breakdown from occurring at the curved edges of the junction between the deep P+ region 9 and the N drift layer 1. A P type buried region 11 which constitutes an anode region of the diode D2 is merged, at one edge, with the annular region 10, and is partially covered by an N-type region 12 which constitutes a cathode region of the diode D2. A second edge of N-type region 12 is merged with an N+ region 13. The P type buried region 11 is obtained, similarly to the buried region 5 of D1, by means of a high-energy implantation of acceptor ions. The peak of the dopant concentration is thus located under the semiconductor surface.

The semiconductor surface is covered by an insulating oxide layer 14, in which contact areas are opened to allow a superimposed metal layer to come into contact with selected semiconductor regions. The metal layer defines a pattern of interconnection lines: a first interconnection line 7 contacts the N type region 6 to connect it to a gate layer G of the power device (not shown). A second interconnection line 8 contacts the annular region 4 to connect it to the P+ deep region 9, which is in turn in electrical contact with the buried region 5 of the diode D1.

Since the equipotential lines crowd at the interface between the P type buried region 11 and the N type region 12, diode D2 undergoes a lateral breakdown. With this configuration, the breakdown voltage of D2 does not depend on the thickness and on the resistivity of the N epitaxial layer 1, and is therefore independent from process variations. The breakdown voltage of D2 depends instead on the dopant concentration and dimensions of the P type buried region 11 and of the N type region 12. Since, however, both the dopant concentration and the dimensions of said two regions can be finely controlled, it is possible to obtain active clamp structures with highly reproducible values for the clamping voltage. Furthermore, since the breakdown region is not located at the semiconductor surface, the breakdown voltage is not affected by the existence of charges in the oxide layer 14 and at the oxide/silicon interface.

With respect to a common manufacturing process for the fabrication of power semiconductor devices, the integration of the active clamp according to the invention only requires the addition of two implantation steps, one of which at a relatively high energy, and two diffusion steps; both the P type buried regions 5 and 11 and the N type regions 6 and 12 are obtained after that all the high-temperature diffusion steps have been performed.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. An integrated structure active clamp for protection of a power semiconductor device against overvoltages, comprising a first diode and a second diode defined in a lightly doped layer of a first conductivity type in which the power semiconductor device is also disposed, the first diode having a first contact connected to a control electrode of the power device and a second contact connected to a second contact of the second diode, a first contact of said second diode being connected to a load driving electrode of the power device, wherein the second contact of the second diode includes a first buried region of a second conductivity type which is buried in the lightly doped layer and the first contact of the second diode includes a first doped region of the first conductivity type which extends from a top surface of the semiconductor into the lightly doped layer to partially overlap the first buried region.

2. The integrated structure active clamp according to claim 1, wherein said first buried region is merged with a first heavily doped deep region of the second conductivity type constituting a contact region disposed below the second contact of the second diode.

3. The integrated structure active clamp according to claim 1, wherein said first buried region is merged with a lightly doped annular region of the second conductivity type which surrounds a first heavily doped deep region of the second conductivity type constituting a contact region disposed below the second contact of the second diode.

4. The integrated structure active clamp according to anyone of claim 1, wherein the second contact of the first diode includes a second buried region of the second conductivity type which is buried in the lightly doped layer and the first contact of the first diode includes a second doped region of the first conductivity type which extends from the semiconductor top surface to the second buried region, said second doped region having a dopant concentration between a dopant concentration in the lightly doped layer and a dopant concentration in the second buried region, so as to reduce a gain of a parasitic bipolar transistor, of the first diode, having an emitter, a base and a collector respectively represented by the second doped region, the second buried region and the lightly doped layer.

5. The integrated structure active clamp according to claim 4, wherein said second buried region is surrounded by and merged with a heavily doped deep annular region of the second conductivity type constituting a contact region to the second contact of the first diode.

6. The integrated structure active clamp according to anyone of claims 1 to 5, wherein the power semiconductor device is a power MOSFET.

7. The integrated structure active clamp according to anyone of claims 1 to 5, wherein the power semiconductor device is an Insulated Gate Bipolar Transistor.

8. The integrated structure active clamp according to anyone of claims 1 to 5, wherein the power semiconductor device is a power Bipolar Junction Transistor.

9. The integrated structure active clamp according to anyone of claims 1 to 8, wherein said first conductivity type regions are semiconductor regions doped with donor impurities and said second conductivity type regions are semiconductor regions doped with acceptor impurities.

10. The integrated structure active clamp according to anyone of claims 1 to 8 wherein said first conductivity type regions are semiconductor regions doped with acceptor impurities, and said second conductivity type regions are semiconductor regions doped with donor impurities.

11. An active clamp for protecting a power semiconductor device against overvoltages, comprising a first diode, a second diode and the power semiconductor device disposed in an epitaxial layer of a first conductivity type, the first diode having a cathode metallization contact connected to a gate electrode of the power device and an anode metallization contact connected to an anode metallization contact of the second diode, a chathode metallization contact of the second diode is connected to a drain electrode of the power device, wherein the anode of the second diode includes a first buried region, of a second conductivity type, which is buried in the epitaxial layer and the cathode of the second diode includes a first doped region, of the first conductivity type, which extends from a top surface of the epitaxial layer into the epitaxial layer to partially overlap the first buried region such that the second diode is formed to be independent of a thickness and a resistivity of the epitaxial layer.

12. The active clamp of claim 11, wherein a breakdown voltage of the second diode is controlled by a dopant concentration and dimension of the first buried region of the second diode.

13. The active clamp of claim 11, wherein a clamping voltage of the active clamp is tightly controlled by controlling a dopant concentration and a dimension of the first buried region so as to produce a breakdown voltage which is sufficient to allow a driving signal to be applied to the gate electrode of the power device without causing the second diode to breakdown when the power device is switched on by the driving signal.

14. The active clamp according to claim 11, wherein the anode of the first diode includes a second buried region, of the second conductivity type, buried in the epitaxial layer and the cathode of the first electrode includes a second doped region, of the first conductivity type, which extends from the top surface of the epitaxial layer to the second buried region, so that a breakdown voltage of the power device is not reduced by a gain of a parasitic bipolar transistor, of the first diode, having an emitter, a base and a collector corresponding, respectively, to the second doped region, the second buried region and the epitaxial layer.

* * * * *